United States Patent [19]

Holland

[11] 3,820,044

[45] June 25, 1974

[54] CASCADE 50 OHM ATTENUATOR SYSTEM HAVING REMOVABLY MOUNTED ATTENUATOR DEVICES

[75] Inventor: Kenneth C. Holland, Portland, Oreg.

[73] Assignee: Tektronix, Inc., Tektronix Industrial Park, Beaverton, Oreg.

[22] Filed: Mar. 5, 1973

[21] Appl. No.: 338,013

Related U.S. Application Data

[63] Continuation-in-part of Ser. No. 114,273, Feb. 10, 1971, Pat. No. 3,753,170.

[52] U.S. Cl. .............................. 333/81 A, 333/84 M

[51] Int. Cl. .............................................. G01p 1/22

[58] Field of Search ........... 333/81 R, 81 A; 323/74, 323/77, 80

[56] References Cited

UNITED STATES PATENTS

| | | | |
|---|---|---|---|
| 2,637,777 | 5/1953 | Kilby et al. | 323/74 X |
| 3,014,187 | 12/1961 | Sher et al. | 333/81 R |
| 3,319,194 | 5/1967 | Adam | 333/81 R |
| 3,626,352 | 12/1971 | McCoig | 333/81 R X |

FOREIGN PATENTS OR APPLICATIONS

| | | | |
|---|---|---|---|
| 763,641 | 12/1956 | Great Britain | 333/81 R |

*Primary Examiner*—Paul J. Gensler
*Attorney, Agent, or Firm*—Adrian J. La Rue

[57] ABSTRACT

In systems associated with high-frequency 50 ohm attenuators, means and methods are provided using hybird chips having circuitry thereon for electrical engagement on etched circuit boards thereby keeping electromagnetic fields between the etched circuit boards and the hybrid chips. Spring clips for maintaining the hybrid chips in position on the etched circuit boards and for maintaining electrical connection between circuitry on the hybrid chips and transmission mediums on the etched circuit board are provided.

10 Claims, 4 Drawing Figures

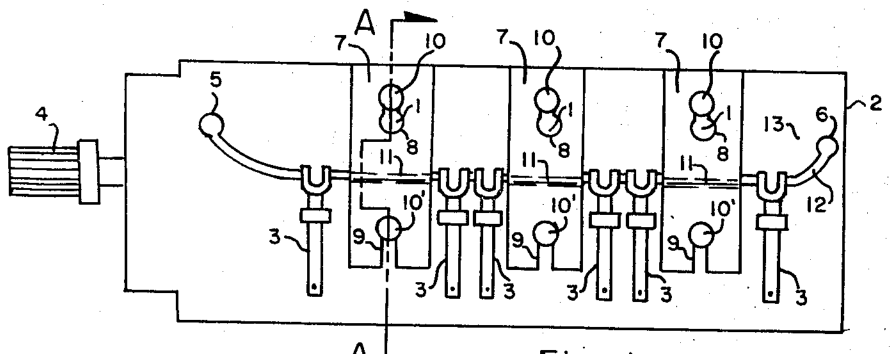
Fig-1
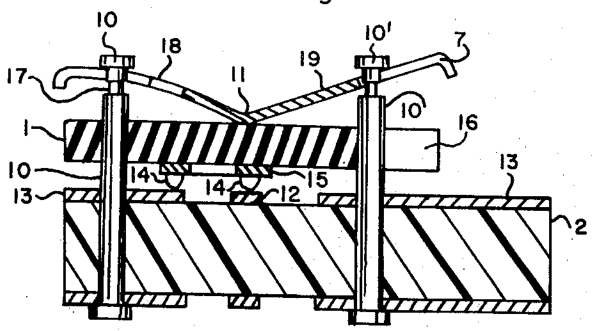
Fig-2 A-A
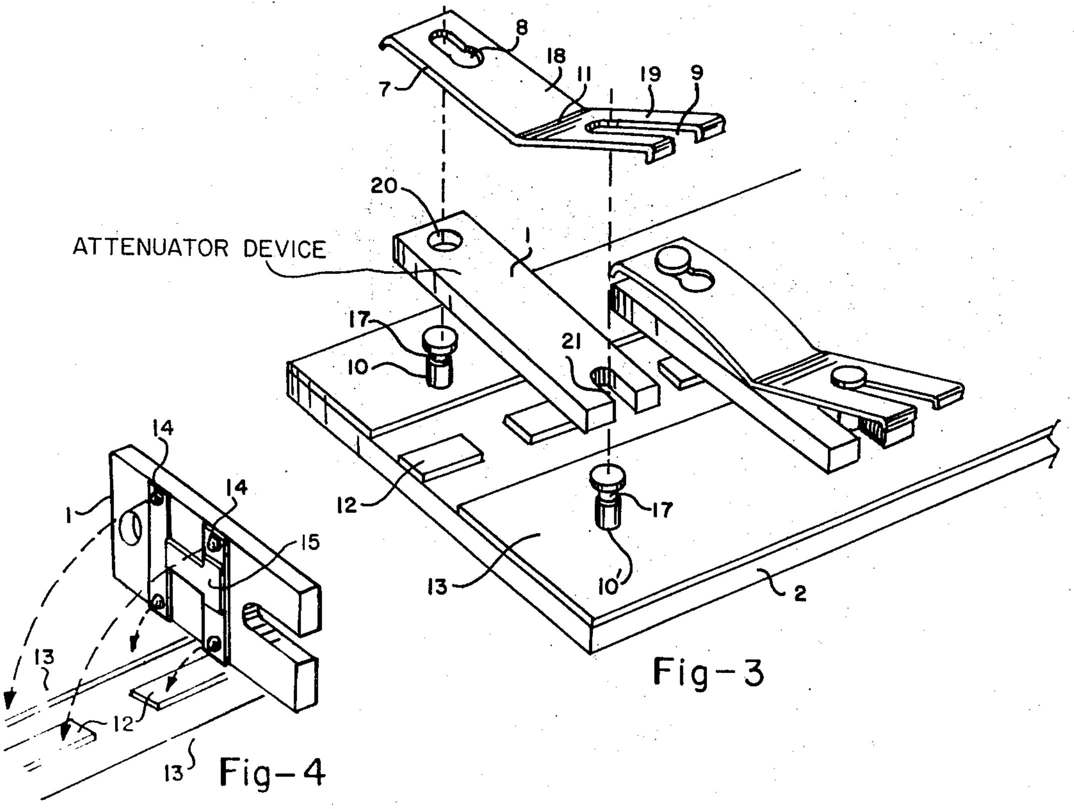
Fig-3, Fig-4

CASCADE 50 OHM ATTENUATOR SYSTEM HAVING REMOVABLY MOUNTED ATTENUATOR DEVICES

CROSS-REFERENCE TO RELATED APPLICATION

This application is a continuation-in-part of U.S. Patent application, Ser. No. 114,273, filed Feb. 10, 1971, now U.S. Pat. No. 3,753,170.

BACKGROUND OF THE INVENTION

One of the problems associated with high-frequency 50 ohm attenuator design is maintaining a constant impedance throughout the attenuator apparatus to achieve minimum loss in the OdB position of the apparatus, and to provide maximum bandwidth. In addition high VSWR, high reflection coefficient, and relatively large size and high cost restrict the present art.

This invention overcomes these above-mentioned problems by using (a) transmission mediums in conjunction with high-frequency contacts which are completely disclosed in U.S. Patent application, Ser. No. 114,273, (b) cam switch means as described in U.S. Pat. No. 3,562,464, and (c) thick filmed insulative substrate inverted on transmission mediums of the mounting member; further by utilizing a plurality of contacts on said substrate to make contact with the mounting member transmission mediums, good high frequency performance is obtained. Further, said substrate maintains electromagnetic fields between the mounting member and hybrid chip rather than within the hybrid chips to provide minimum reflections and maximum bandwidth.

It is therefore one object of the present invention to provide an improved 50 ohm attenuator apparatus of simple, compact, and inexpensive construction.

Another object of the present invention is to provide an attenuator apparatus wherein electromagnetic fields are maintained between the hybrid chip and mounting member.

A further object of the present invention is to provide an attenuator apparatus in which a mounting means for connecting the attenuator device to the mounting member is provided.

An additional object of the present invention is the provision of an attenuator apparatus in which hybrid chip means has electrical circuit means thereof connected through contact means thereon to transmission medium means of a mounting member to which the hybrid chip means is mounted.

A still further object of the present invention is to provide spring clip means having slot means latchably mateable with mounting post means provided on said mounting means for securing an electrical circuit device in position on the mounting means.

A still further additional object of the present invention is to provide an attenuator apparatus wherein alignment slot means and alignment hole means are provided therein said attenuator device for acceptance of said mounting post means on said mounting member means for alignment of said attenuator device with said transmission medium on said mounting means.

An additional still further object of the present invention is to provide said spring clip means as a single unit wherein said unit consists of a first section and a second section having said slot means therein, said first section means including a keyhole slot and said second section means including a U-shape slot for latchably mating with mounting post means, said first and said second sections forming a supplemental angle, the apex of said angle thus forming a V-shaped contact means for securing said attenuator devices in position on said mounting member when latchably mated with mounting post means, said first and second sections having ends which extend in a downward direction.

The subject matter of the present invention is particularly pointed out and distinctly claimed in the following description. The invention, however, both to organization and method of operation together with further advantages and objectives thereof may best be understood by reference to the following description taken in connection with the accompanying drawings wherein like reference characters refer to like elements.

BRIEF DESCRIPTION OF DRAWINGS

In the drawings:

FIG. 1 is a top plane view of the attenuator apparatus;

FIG. 2 is an end view of the attenuator apparatus taken along the line AA of FIG. 1 without showing prior art for purposes of clarity; and FIG. 3 is a perspective view of the attenuator apparatus without prior art showing the apparatus broken away for purposes of clarity.

FIG. 4 is a bottom perspective view of the attenuator device.

DESCRIPTION OF PREFERRED EMBODIMENT

As shown in FIGS. 1, 2, and 3, one embodiment of the attenuator apparatus of the present invention includes three attenuation devices 1 of different attenuation values e.g., X2, X5, and X10; however, these values can be any value desired. These attenuator devices are provided as clip-on hybrid units mounted on one side of a mounting member 2 which can be selectively connected in cascade through high frequency switches 3 (completely disclosed in U.S. Patent application, Ser. No. 114,273) mounted on both an upper and lower surface of the mounting member 2 by rotation of a cam activated control 4 (as set forth in U.S. Pat. No. 3,562,464 of Vollum et al.) between an input terminal 5 and an output terminal 6. Spring clips 7, each having a keyhole slot 8 and an open end U-shape slot 9, are engaged with grooves 17 in mounting posts 10 and 10′ extending through the attenuator devices 1. The spring clips, once engaged with the grooves 17, make contact with the attenuator devices along the line 11 to secure the attenuator device so that electrical and mechanical connection is obtained between the mounting member and the attenuator device.

As shown in FIG. 2, each attenuator device 1 of the attenuator apparatus makes electrical contact with the mounting member 2 transmission medium 12 and the mounting member 2 ground plane 13 via a plurality of protuberances 14 which are electrically connected to the attenuation circuitry on mesa 15, see FIG. 4. The attenuation circuitry can be a plurality of such circuits well-known by those skilled in the art. The mesa, in turn, is part of a substrate 16 defining insulating material. The position of the substrate 16 in relation to the mounting member and transmission medium causes electromagnetic fields to be maintained between the mounting member and the attenuator device. As a result of this technique, high frequency response, low reflections, and high performance can be achieved.

To maintain the hybrid chip in position, mounting posts 10 and 10' are provided on the mounting member and extend through an alignment hole and slot of each attenuator device (see FIG. 3) so that when spring clip 7 is engaged with mounting post grooves 17, contact between the spring clip and attenuator device along the line 11 is obtained. The spring clip is a single unit of metal, bent along the line 11, so that a first section 18 and a second section 19 form a complementary angle whose apex is also at 11. Each end of said first section 18 and said second section 19 is turned in a downward direction thereby eliminating sharp edges for obvious reasons. Mounting posts 10 and 10' also extend through mounting member 2 and are secured to the bottom portion of said mounting member using conventional methods. This connection ensures that both the upper and lower ground planes of the mounting member are in electrical connection as well as providing a mechanical connection means for spring clips 7.

FIG. 3, a perspective view of the attenuator apparatus, shows the mounting details. Mounting member 2 carries mounting posts 10 and 10' which extend in an outwardly direction at right angles to said mounting member as well as through the circuit board as described above. The outward portion of the mounting posts 10 and 10' pass through an alignment hole 20 and an alignment slot 21 respectively in the attenuator device 1. The alignment hole and alignment slot of the attenuator device aligns said plurality of protuberencies 14 with the mounting member transmission medium 12 and ground plane 13 (see FIG. 2 and FIG. 4). Next, spring clip 7 having said first section 18 containing a keyhole slot 8 and said second section 19 containing an open U-shape slot 9 is placed so that the key portion of the keyhole slot in said first section accepts mounting post 10 protruding through the attenuator device alignment hole and that the open U-shaped slot of said second section accepts mounting post 10' protruding through the attenuator device alignment slot. By applying laterally pressure to the downward end of said sections, spring clip 7 latchably mates with the grooves 17 of mounting posts 10 and 10' thereby providing the electrical and mechanical contact therebetween which is maintained via the spring clip.

While there has been shown and described the preferred embodiment of the present invention, it will be apparent to those skilled in the art that many changes and modifications may be made without departing therefrom in its broader aspects. Therefore, the appended claims are intended to cover all such changes and modifications as fall within the true spirit and scope of this invention.

The invention is claimed is accordance with the following:

1. An attenuator apparatus comprising:

attenuator device means containing attenuator circuits of selectable attenuation values;

an electrical mounting member having transmission mediums divided into portions electrically insulated from each other on an insulator member;

contact means for connecting said attenuator device means on the mounting member for providing electrical contact between certain of said portions of said transmission mediums;

clip-on mounting means to removably secure said attenuator device means on the mounting member for mechanical connection between said mounting member and said attenuator device means; and switch means for selectively electrically connecting said portions on said electrical mounting member to connect said attenuator device means in cascade between an input terminal and an output terminal.

2. Attenuator apparatus in accordance with claim 1 in which said contact means is included as a portion of said attenuator device means.

3. Attenuator apparatus in accordance with claim 2 in which said contact means is a plurality of protuberancies for electrically connecting said attenuator device means on said mounting member.

4. Attenuator apparatus in accordance with claim 3 in which said attenuator device means is mounted on a base material defining insulation means having deposited thereon circuitry for selectable attenuation, and said contact means.

5. Attenuator apparatus in accordance with claim 4 wherein said attenuator device means forms a hybrid chip.

6. Attenuator apparatus in accordance with claim 5 in which said hybrid chip in contact with said transmission mediums on said mounting member maintains electromagnetic fields between said mounting member and said attenuator device means.

7. An attenuator apparatus, comprising:

mounting means including dielectric means having ground plane means and signal conductor means insulatively spaced from one another along said dielectric means, said signal conductor means defining separate segment means;

input terminal means provided by one of said separate segment means;

output terminal means provided by another of said separate segment means;

attenuator means having attenuator circuit means thereon;

contact means provided on said attenuator means in electrical contact with said attenuator circuit means, said contact means being in electrical engagement with said ground plane means and said one and other separate segment means; and means for removably securing said attenuator means in position on said mounting means.

8. An attenuator apparatus according to claim 7 wherein said one and other separate segment means are divided into further separate segment means, and switch means mounted on said mounting means for engagement between said further separate segment means to electrically connect same together.

9. The apparatus according to claim 7 wherein said means for removably securing said attenuator means defines spring clip means for releasable attachment to said mounting means.

10. The apparatus according to claim 7 wherein said means for removably securing said attenuator means releases both electrical and mechanical securing simultaneously.

* * * * *